United States Patent
Chen et al.

(10) Patent No.: US 8,658,961 B2
(45) Date of Patent: Feb. 25, 2014

(54) INPUTTING MODULE AND SUBMOUNT THEREOF AND MANUFACTURING METHOD OF THE SUBMOUNT

(75) Inventors: Chih-Cheng Chen, Zhongli (TW); Jin-Shan Pan, Hsinchu (TW)

(73) Assignee: True Light Corporation, Hsinchu (TW)

( * ) Notice: Subject to any disclaimer, the term of this patent is extended or adjusted under 35 U.S.C. 154(b) by 412 days.

(21) Appl. No.: 13/198,902

(22) Filed: Aug. 5, 2011

(65) Prior Publication Data
US 2013/0032701 A1    Feb. 7, 2013

(51) Int. Cl.
*H01J 3/14* (2006.01)
(52) U.S. Cl.
USPC ........................................ 250/216
(58) Field of Classification Search
USPC ......... 250/216, 227.11; 356/71; 382/124, 127
See application file for complete search history.

(56) References Cited

U.S. PATENT DOCUMENTS

| 5,233,404 | A | * | 8/1993 | Lougheed et al. | 356/71 |
| 6,128,084 | A | * | 10/2000 | Nanbu et al. | 356/369 |
| 6,175,407 | B1 | * | 1/2001 | Sartor | 356/71 |

* cited by examiner

*Primary Examiner* — Seung C Sohn
(74) *Attorney, Agent, or Firm* — Chun-Ming Shih; HDLS IPR Services

(57) ABSTRACT

A submount is used for disposing an illuminant element or a light-receiving element having an optical axis. The submount is disposed at a plane and has a main body. The main body includes a first surface and a second surface. The first surface is approximately parallel to the plane and far away from the plane. The second surface is approximately parallel to the plane and adjacent to the plane. A disposing part of the first surface is tilted with respect to the second surface at a predetermined angle. The illuminant element or the light-receiving element is disposed on the disposing part. The optical axis of the illuminant element or the light-receiving element is tiled with respect to a normal of the second surface at the predetermined angle.

20 Claims, 7 Drawing Sheets

INPUTTING MODULE AND SUBMOUNT THEREOF AND MANUFACTURING METHOD OF THE SUBMOUNT

BACKGROUND OF THE INVENTION

1. Field of the Invention

The present invention relates to an inputting module, and in particular to an optical finger navigation inputting module.

2. Description of Prior Art

Optical finger navigation (OFN) inputting module has advantages of small volume, high precision of navigation and low power consumption and is widely applied in movable device, such as smart phone, personal media player, digital camera and global positioning system (GPS) navigator.

Reference is made to FIG. 8, which is a cross sectional view of a conventional optical finger navigation inputting module. The optical finger navigation inputting module 90 includes an illuminant element 92, a sensing unit 94, a first lens element 96 and a second lens element 98. The illuminant element 92 emits a light. The light is transmitted to the first lens element 96 and the first lens element 96 deflects the transmission route of the light and injects the light to an operation plane S. The sensing unit 94 senses a reflected light reflected from the operation plane S by touching with user's finger or other styluses and converged by the second lens element 98.

However, the first lens element 96 used for deflecting light emitted from the illuminant element 92 of the optical finger navigating inputting module 90 and the second lens element 98 used for converging reflecting light emitted from the illuminant element 92 and reflected from the operation plane S by touch with user's finger or other styluses cause the thickness of the optical finger navigating module 90 cannot be effectively reduced. This makes the optical finger navigating module 90 with difficulty for applying in movable devices designed by the goal of the thinner, smaller and convenient to carry.

SUMMARY OF THE INVENTION

Accordingly, the present invention provides an inputting module and submount thereof and manufacturing method of the submount.

The present invention provides a submount for optical device, the submount is disposed on a plane and used for disposing an illuminant element or a light-receiving element having an optical axis, the submount includes a main body. The main body includes a first surface and a second surface. The first surface is parallel to the plane and far away from the plane and the second surface is parallel to the plane and adjacent to the plane. Wherein, a disposing part of the first surface is tilted with respect to the second surface at a predetermined angle, the illuminant element or the light-receiving element is disposed on the disposing part and the optical axis of the illuminant element or the light-receiving element is tiled with respect to a normal of the second surface at the predetermined angle.

Moreover, the present invention provides an inputting module, the inputting module includes a circuit board, an illuminant element package and a sensing element. The circuit board has an upper surface and a lower surface. The illuminant element package is disposed on the upper surface of the circuit board, the illuminant element package includes a submount and an illuminant element. The submount includes a first surface and a second surface. The first surface is parallel to the circuit board and far away from the circuit board, and the second surface is parallel to the circuit board and adjacent to the circuit board, a disposing part of the first surface is tilted with respect to the second surface at a predetermined angle. The illuminant element has an optical axis and is disposed on the upper surface of the circuit board, the optical axis of the illuminant element is tiled with respect to a normal of the second surface at the predetermined angle. The sensing element is disposed on the upper surface of the circuit board, the sensing element includes a sensing surface and a rear surface which is opposite to the sensing surface, the sensing surface has a sensing area.

Furthermore, the present invention provides a manufacturing method of the submount, the submount used for disposing an illuminant element or a light-receiving element, the method includes: providing a silicon ingot; cutting the silicon ingot into a plurality of wafer along a predetermined lattice plane with a predetermined angle; coating a photoresist layer on a surface of the wafer; providing a mask and positioning on the surface which coated with the photoresist layer; providing a light source to illuminate the wafer to exposure the photoresist layer; removing the mask; providing a developing solution and putting the wafer into the developing solution to remove the non-necessity part of the photoresist layer; providing an etching solution and putting the wafer into the etching solution to form a plurality of recess on the wafer; providing at least an electrode and attaching to the wafer and cutting the wafer into a plurality of submounts.

The inputting module of the present invention deflects the optical axis of the illuminant element by the submount having the disposing part so that the inputting module does not need additional lens element to deflect the optical axis of the illuminant element and the thickness of the inputting module can be reduced for applying in thinner movable device.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

A preferred embodiment of the present invention will be described with reference to the drawings.

Figure 1:
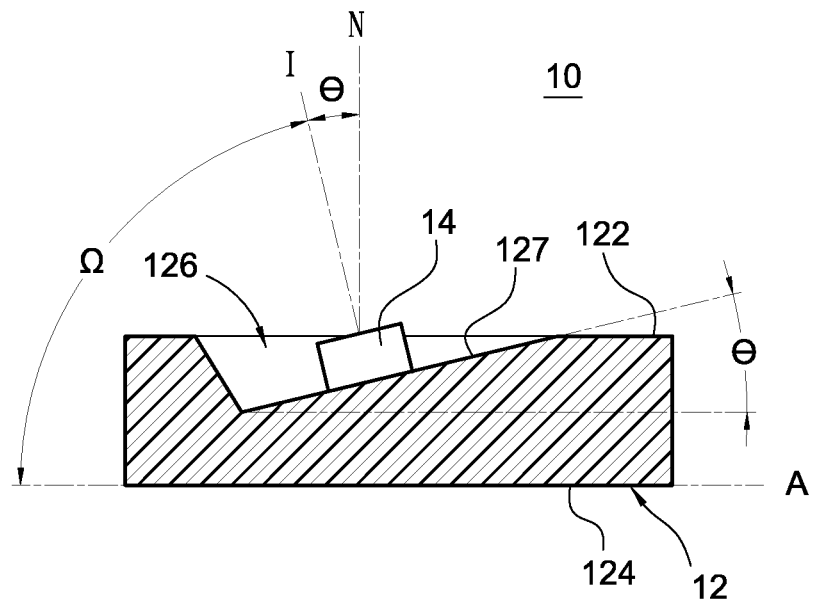
FIG. 1 is a cross sectional view of an illuminant element package according to a first embodiment of the present invention.
Figure 2A:
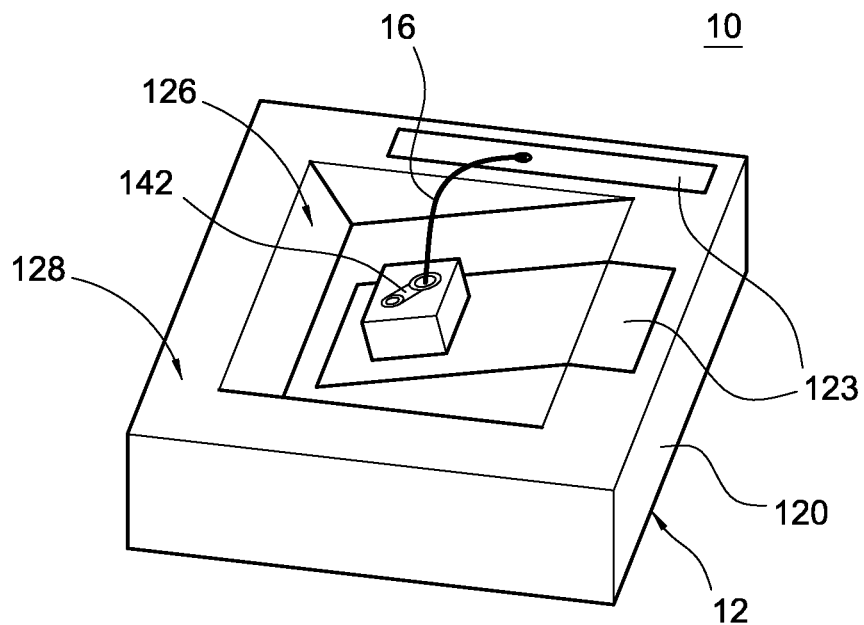
FIG. 2A is a perspective view of the illuminant element package according to the first embodiment of the present invention.
Figure 2B:
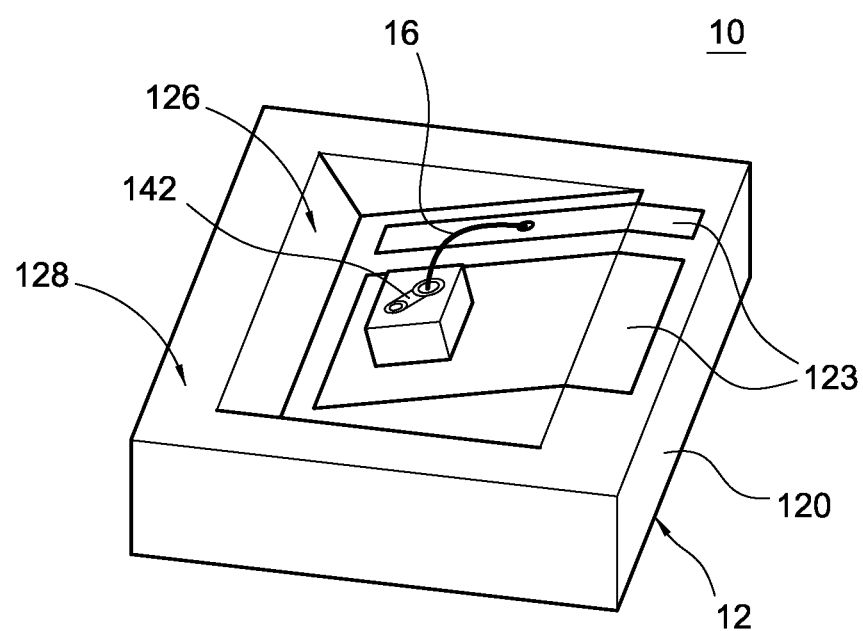
FIG. 2B is another perspective view of the illuminant element package according to the first embodiment of the present invention.

Reference is made to FIG. 1 and FIG. 2A, which are a cross sectional view and a perspective view of an illuminant element package according to a first embodiment of the present invention, respectively. The illuminant element package 10 includes a submount 12 and an illuminant element 14. The submount 12 is disposed on a surface A and has a main body 120. The main body 120 includes a first surface 122 and a second surface 124 which is opposite to the first surface 122. The first surface 122 is approximately parallel to and far away from the surface A and the second surface 124 is approximately parallel to and adjacent to the surface A. The first surface 122 includes a disposing part and a platform 128 which is opposite to the disposing part. In this embodiment, the disposing part is a recess 126 and the recess 126 is an asymmetric V shaped recess. The recess 126 has a bottom surface 127 and the bottom surface 127 is tilted with respect to the second surface 124 at a predetermined angle $\theta$ of between five and forty-five degrees. The submount 12 is manufactured by semiconductor material, such as silicon. Two electrodes 123 are disposed on the first surface 122, one of the electrodes 123 is attached the bottom surface 127 of the recess 126 and another electrode 123 is attached to the platform 128, however, the two electrodes 123 may be all attached to the bottom surface 127 of the recess 128 (as shown in FIG. 2B).

The illuminant element 14 is a vertical-cavity surface emitting laser (VCSEL) die for emitting a laser beam. The illuminant element 14 is disposed on the bottom surface 127 of the recess 126 of the submount 12 and can be adhered to the bottom surface 127 via a conductive adhesive (not shown). The illuminant element 14 has an optical axis I. As used herein, the optical axis I refers to an axis around which the light emitting from the illuminant element 14 is centered. In general, the optical axis I is a central axis of an optical system having a characteristic of symmetric.

The illuminant element 14 further includes two conductive electrodes 142. The conductive electrodes 142 are electrically connected to the two electrodes 123 attached to the first surface 122 of the submount 12. One of the conductive electrodes 142 may be directly electrically connected to the one of the electrodes 123 attached to the bottom surface 127 via an adhesive with electric conductivity, such as conductive adhesive (not shown) and another conductive electrode 142 is electrically connected to another electrode 123 attached to the first surface 122 via a wire 16, however, the two conductive electrodes 142 may be electrically connected to the two electrodes 123 via two wires 16.

The illuminant element 14 is disposed on the recess 126 and attached to the bottom surface 127 of the recess 126. The bottom surface 127 is tilted with respect to the second surface 124 at the predetermined angle $\theta$ so that the optical axis I of the illuminant element 14 is at the predetermined angle $\theta$ relative to a normal N of the second surface 124. The normal N is perpendicular to the second surface 124. The illuminant element 14 emits a beam which is symmetrical to the optical axis I. For simplicity, only a light overlapping the optical axis I will be mentioned hereafter. Because of the illuminant element 14 positioning on the submount 12, the illuminant element 14 is thereby oriented to emit light at the first angle $\Omega$ related to the second surface 124. In particularly, the first angle $\Omega$ is a supplement of the predetermined angle $\theta$ and the first angle $\Omega$ can be modified according to the predetermined angle $\theta$.

Besides, the submount 12 may be used for disposing a light receiving element. The light receiving unit is disposed on the bottom surface 127 and electrically connected to the electrodes 123, so that an optical axis I of the light receiving element can tilt with respect to the normal N of the second surface 124 at the predetermined angle $\theta$.

Figure 3A:
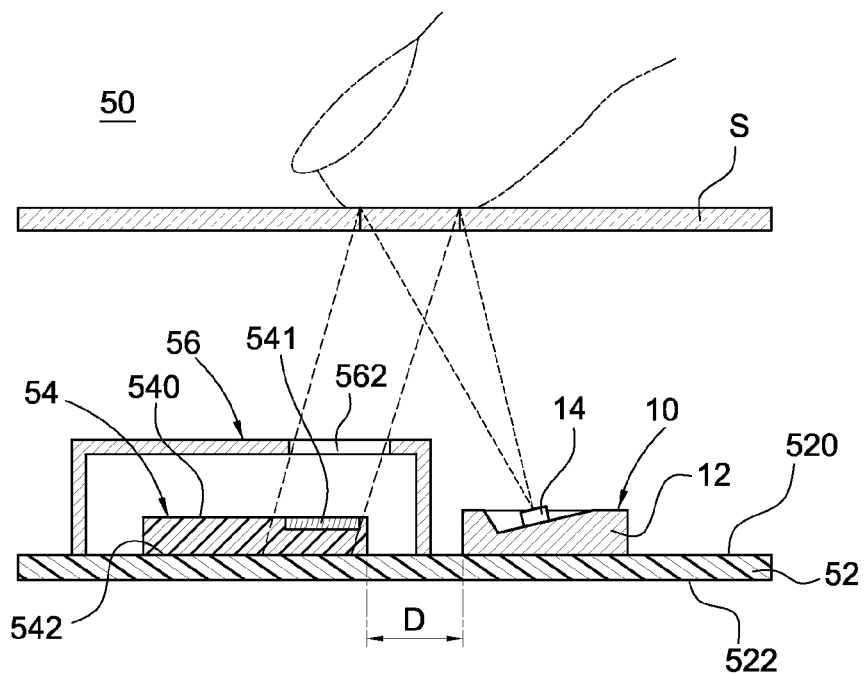
FIG. 3A is a partially cross sectional view of an inputting module according a first embodiment of the present invention.

Reference is made to FIG. 3, which is a partially cross sectional view of an inputting module according a first embodiment of the present invention. The inputting module 50 includes a circuit board 52, an illuminant element package 10, a sensing element 54 and a shield 56.

The circuit board 52 has an upper surface 520 and a lower surface 522 which is opposite to the upper surface 520. The circuit board 52 may be a printed circuit board (PCB) or a flexible printed circuit (FPC) board and has preset circuit wirings by manufacture of printing and etching.

The illuminant element package 10 is attached to the upper surface 520 of the circuit board 52 and electrically connected thereto. The illuminant element package 10 includes a submount 12 and an illuminant element 14. The submount 12 includes a first surface 122 and a second surface 124 which is opposite to the first surface 122 (referring to the FIG. 1). The first surface 122 is approximately parallel to the circuit board 52 and far away from the circuit board 52 and the second surface 124 is approximately parallel to the circuit board 52 and adjacent to the circuit board 52.

The first surface 122 includes a disposing part and a platform 128 which is opposite to the disposing part. In this embodiment, the disposing part is a recess 126 and is an asymmetric V shaped recess. The recess 126 has a bottom surface 127. The bottom surface 127 is tilted with respect to the second surface 124 at a predetermined angle $\theta$ of between five and forty-five degrees.

The illuminant element 14 is disposed on the recess 126 and attached to the bottom surface 127. Because the bottom surface 127 is tilted with respect to the second surface 124 at the predetermined angle $\theta$, the optical axis I of the illuminant element 14 is at the predetermined angle $\theta$ relative to a normal N of the second surface 124. The normal N is perpendicular to the second surface 124. The illuminant element 14 is thereby oriented to emit light at the first angle $\Omega$ related to the second surface 124. In particularly, the first angle $\Omega$ is a supplement of the predetermined angle $\theta$ and the first angle $\Omega$ can be modified according to the predetermined angle $\theta$.

The second surface 124 of the submount 12 of the illuminant element package 10 is attached to the upper surface 520 of the circuit board 52 so that the optical axis I of the illuminant element 14 is at the first angle $\Omega$ relative to the upper surface 520 and thereby oriented to emit light to the operation plane S. The operation plane S is exemplified as a transmissive housing of a movable device or a casing having an opening for allowing user to touch by finger or other styluses.

The sensing element 54 is disposed on the circuit board 52 and electrically connected to the circuit board 52. A predetermined distance D is located between the sensing element 54 and the illuminant element package 10 and the predetermined distance D may be modified according the predetermined angle $\theta$.

The sensing element 54 includes a sensing surface 540 and rear surface 542 which is opposite to the sensing surface 540. The rear surface 542 of the sensing element 54 is attached to the upper surface 520 of the circuit board 52. The sensing element 54 further includes a sensing area 541 for sensing light and converting the light to an electrical signal. The sensing element 54 may be a complementary metal-oxide-semiconductor (CMOS) image sensing element, however, the present invention is not limited to implementations in the CMOS image sensing element. Instead, the invention also includes implementations in which sensing components are used in other type of electronic devices. The sensing element 54 senses a reflecting light reflected from the operation plane S by touch of user's finger or other styluses and converts the reflecting light to corresponding electrical signal.

The shield 56 is positioned on the sensing element 54. The shield 56 has an opening 562, the opening 562 is used for allowing the reflecting light reflected from the operation plane S effectively to be sensed by the sensing area 541 and prevent scattering light from inputting into the sensing area 541 and influencing the sensing effect of the sensing element 54.

The illuminant element 14 of the inputting module 50 is disposed on the bottom surface 127 of the recess 127 so that the optical axis I of the illuminant element 14 is at the first angle Ω (shown in FIG. 1) relative to the circuit board 52 and then the illuminant element 14 emits light along the optical axis I. Thus, a movable device having the inputting device 50 does not need an additional lens element to deflect light and can effectively reduce the thickness of the inputting module 50 to apply in thin movable devices.

Figure 3B:
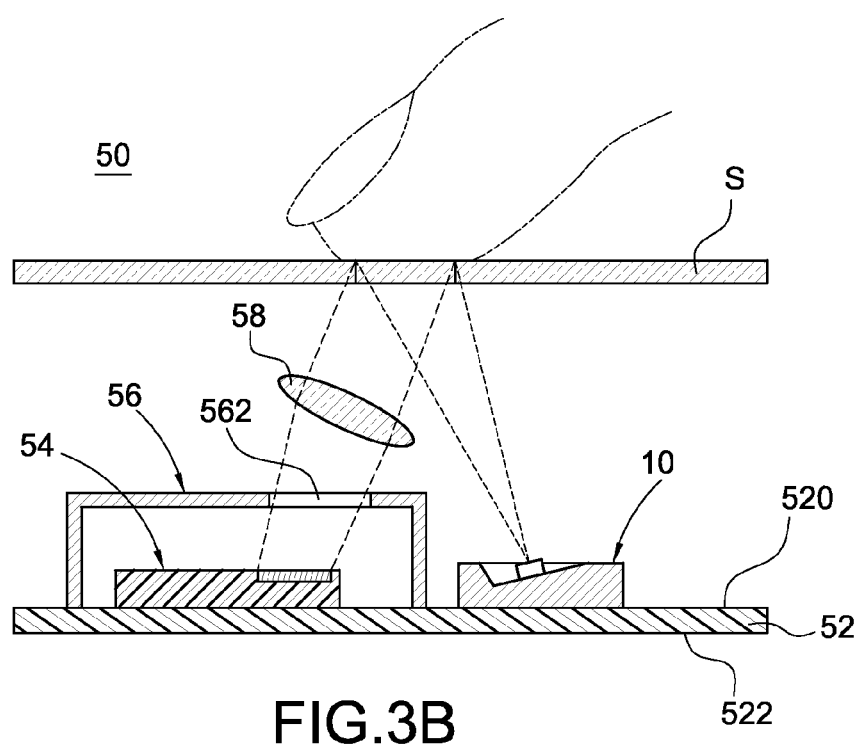
FIG. 3B is a partially cross sectional view of an inputting module according to a second embodiment of the present invention.

Reference is made to FIG. 3B, which is a partially cross sectional view of an inputting module according to a second embodiment of the present invention. The inputting module is similar to the first embodiment mentioned above, but a light converging element 58 is positioned between the operation plane S and the sensing element 54 for focusing the light reflected from the operation plane S and caused by touch of user's finger or other styluses. The converging element 58 is exemplified as a bi-convex lens, however, the present invention is not limited to implementations in the bi-convex lens. Instead, the invention also includes implementations in which converging components are used in other type of optical devices.

Figure 4A:
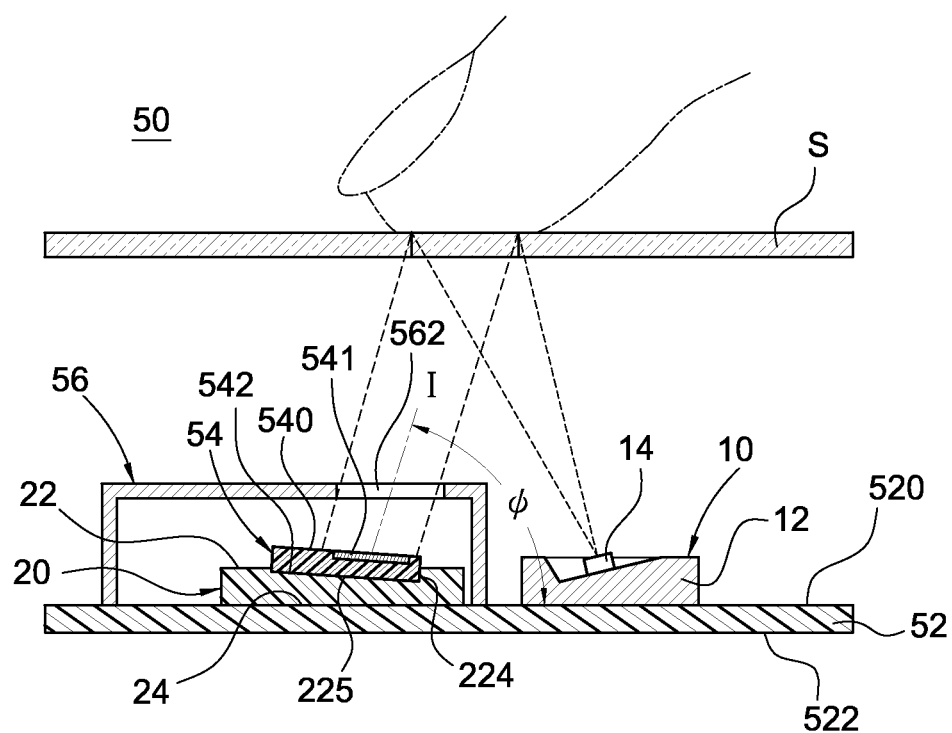
FIG. 4A is a partially cross sectional view of an inputting module according to a third embodiment of the present invention.
Figure 4B:
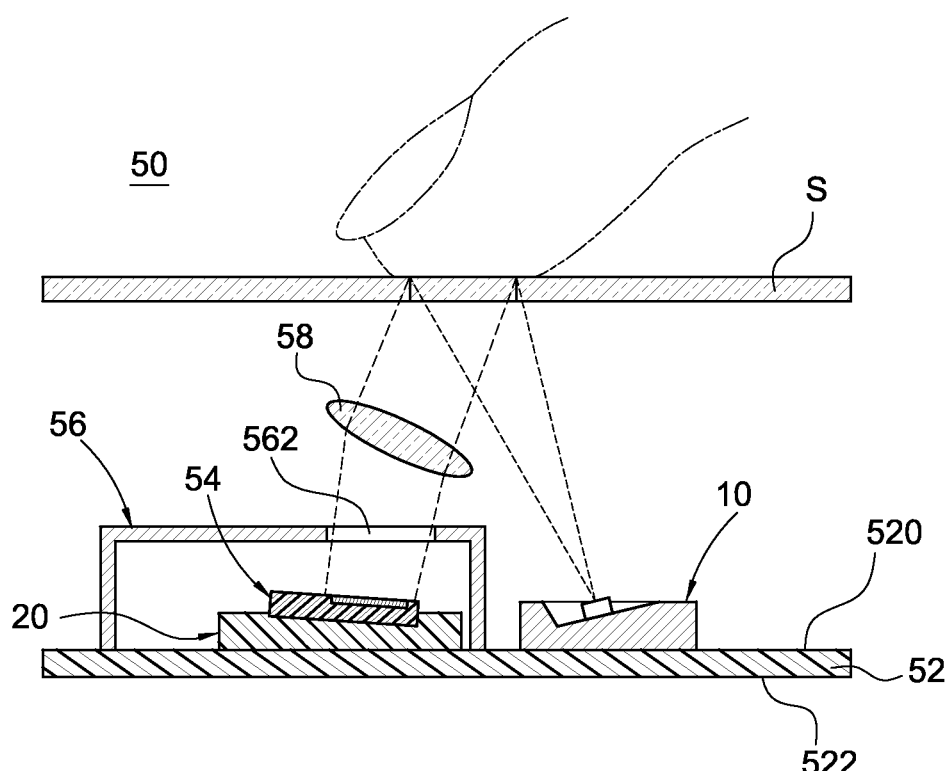
FIG. 4B is a partially cross sectional view of an inputting module according to a fourth embodiment of the present invention.

Reference is made to FIG. 4A, which is a partially cross sectional view of an inputting module according to a third embodiment of the present invention. The inputting module is similar to the first embodiment mentioned above, but is different in that the rear surface 542 of the sensing element 54 further includes a submount 20, the submount 20 has a first surface 22 and a second surface 24 which is opposite to the first surface 22. The first surface 22 includes a disposing part, and in this embodiment, the disposing part is a recess 224, in particularly, the recess 224 is an asymmetric V shaped recess. The recess 224 has a bottom surface 225 and the bottom surface 225 is tilted with respect to the second surface 24 at a predetermined angle θ of between five and forty-five degrees. The submount 20 is manufactured by semiconductor material, such as silicon.

The sensing element 54 is disposed on the submount 20, and more particularly, the sensing element 54 is fastened on the submount 20 via an adhesive (not shown). The second surface 24 of the submount 20 is attached to the upper surface 520 of the circuit board 52 so that the sensing element 54 can sense light at a second angle Ψ relative to the upper surface 522 of the circuit board 52 and the reflecting light can be easily sensed by the sensing element 54. The sensing element 54 may be a CMOS image sensing element, however, the present invention is not limited to implementations in the CMOS image sensing element. Instead, the invention also includes implementations in which sensing components are used in other type of electronic devices.

Reference is made to FIG. 4A, which is a partially cross sectional view of an inputting module according to a fourth embodiment of the present invention. The inputting module is similar to the first embodiment mentioned above, but a light converging element 58 is positioned between the operation plane S and the sensing element 54 for focusing the light reflected from the operation plane S and caused by touch of user's finger or other styluses. The converging element 58 is exemplified as a bi-convex lens, however, the present invention is not limited to implementations in the bi-convex lens. Instead, the invention also includes implementations in which converging components are used in other type of optical devices.

Figure 5:
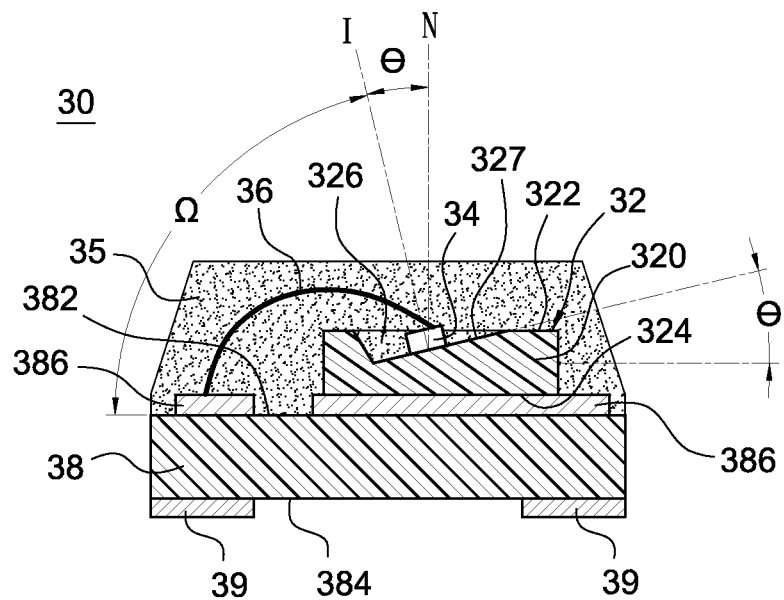
FIG. 5 is a cross sectional view of an illuminant element package according to a second embodiment of the present invention.
Figure 6:
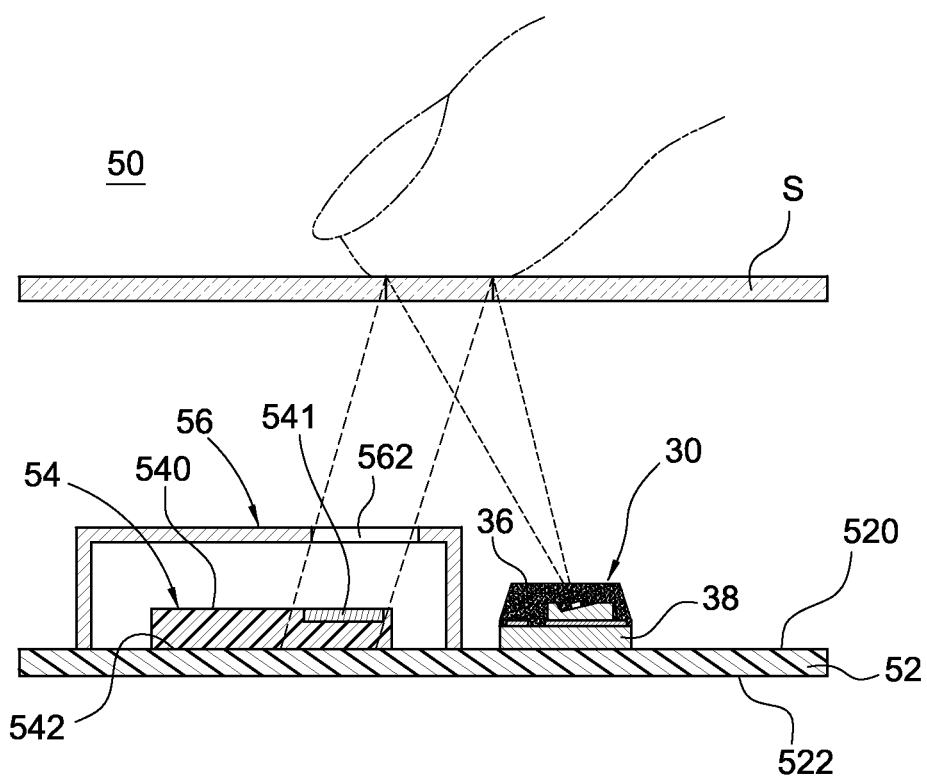
FIG. 6 is a partially cross sectional view of an illuminant element package according to a fifth embodiment of the present invention.

Reference is made to FIG. 5 and FIG. 6, which are a cross sectional view of an illuminant element package according to a second embodiment of the present invention and a partially cross sectional view of an illuminant element package according to a fifth embodiment of the present invention, respectively. The inputting module 50 includes a circuit board 52, an illuminant element package 30, a sensing element 54 and a shield 56.

The circuit board 52 has an upper surface 520 and a lower surface 522 which is opposite to the upper surface 520. The circuit board 52 may be a printed circuit board (PCB) or a flexible printed circuit (FPC) board and has preset circuit wirings by manufacture of printing and etching.

The illuminant element package 30 is a surface mount type illuminant element package. The illuminant element package 30 includes a submount 32, an illuminant element 34, at least a wire 36, an intermediary board 38 and two solder pads 39. The submount 32 has a main body 320 having a first surface 322 and a second surface 324 which is opposite to the first surface 322. The first surface 322 has a disposing part, and in this embodiment, the disposing part is a recess 326 which is hollowed toward the second surface 324. The recess 326 has a bottom surface 327. The bottom surface 327 is tilted with respect to the second surface 324 at a predetermined angle θ of between 5 and 45 degrees. The submount 32 is manufactured by semiconductor material, such as silicon.

The illuminant element 34 has an optical axis I and is disposed on the bottom surface 327 of the recess 326. The optical axis I of the illuminant element 34 is at the predetermined angle θ relative to a normal N of the second surface 324. The illuminant element 34 is a vertical-cavity surface emitting laser die and further includes two conductive electrodes (not shown).

The intermediary board 38 includes an upper surface 382, a lower surface 384 which is opposite to the upper surface 382 and two electrodes 386. The two electrodes 386 are attached to the upper surface 382 of the intermediary board 38. The illuminant element 34 disposed on the submount 32 is attached to one of the electrodes 386 and electrically connected thereto, more particularly, one of the conductive electrodes of the illuminant element 34 can be electrically connected to one of the electrodes 386 via an adhesive with conductive characteristic, such as conductive adhesive. Another conductive electrode of the illuminant element 34 is electrically connected to another electrode 386 so that the optical axis I of illuminant element 34 is at a first angle Ω related to the upper surface 382 of the intermediary board 38. The two solder pads 39 are disposed on the lower surface 384 of the intermediary board 38 and can be electrically connected to the electrodes 386 via through-holes (not shown).

The illuminant element package 30 further includes a transmissive adhesive 35. The illuminant element 34 and the wire 36 are enclosed within the transmissive adhesive 35 to prevent from steam and dust, which decease the luminous efficiency and service life.

Referring to FIG. 6 again, because of the second surface 324 of the main body 32 of the submount 32 of the illuminant element package 30 is attached on the upper surface 520 of the circuit board 52, the optical axis I of the illuminant element 34 is at the first angle Ω relative to the upper surface 520 and emits light to the operation plane S along the optical axis I.

The sensing element 54 includes a sensing surface 540 and a rear surface 542 which is opposite to the sensing surface 540. The sensing surface 540 has a sensing area 541. The sensing element 54 is disposed on the circuit board 52 and the rear surface 542 of the sensing element 54 is attacked to the upper surface 520 of the circuit board 52. The sensing element 54 may be a CMOS image sensing element, however, the present invention is not limited to implementations in the CMOS image sensing element. Instead, the invention also includes implementations in which sensing components are used in other type of electronic devices.

The shield 56 is disposed on the circuit board 52 and positioned on the sensing element 54. The shield 56 has an opening 562 and the opening 562 is approximately aligned to the sensing area 541 of the sensing element 54 for allowing the light to be sensed by the sensing area 541.

Besides, the sensing element 54 may be disposed on the circuit board 52 via a submount 32, its action and related description are the same as mentioned in the third embodiment, and not description in detail herein.

Furthermore, the inputting module 50 includes a converging element (not shown), its action and related description are the same as mentioned in the first embodiment, and not description in detail herein.

Figure 7:
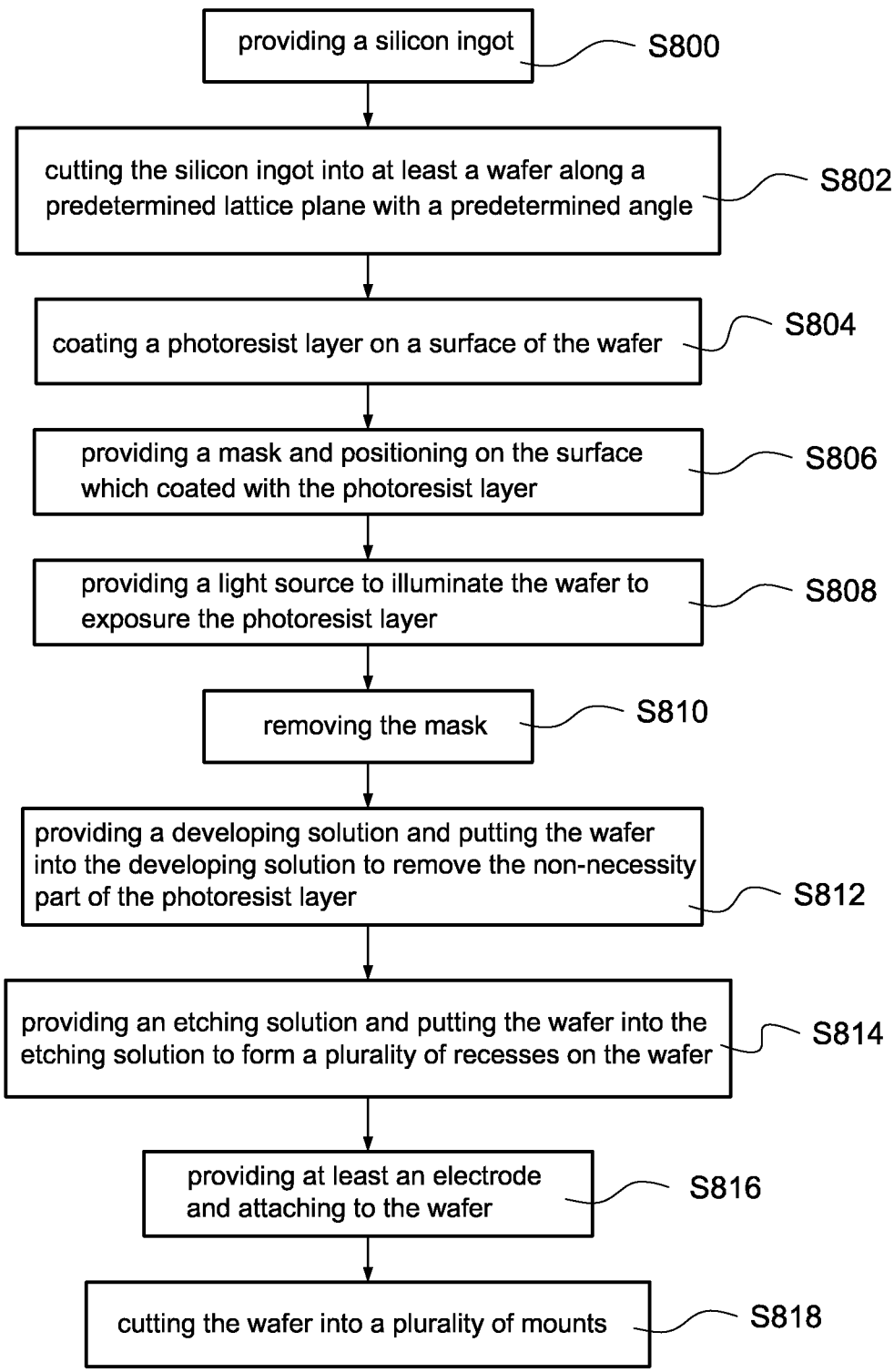
FIG. 7 is a flow chart showing a manufacturing method of a submount of the present invention.
Figure 8:
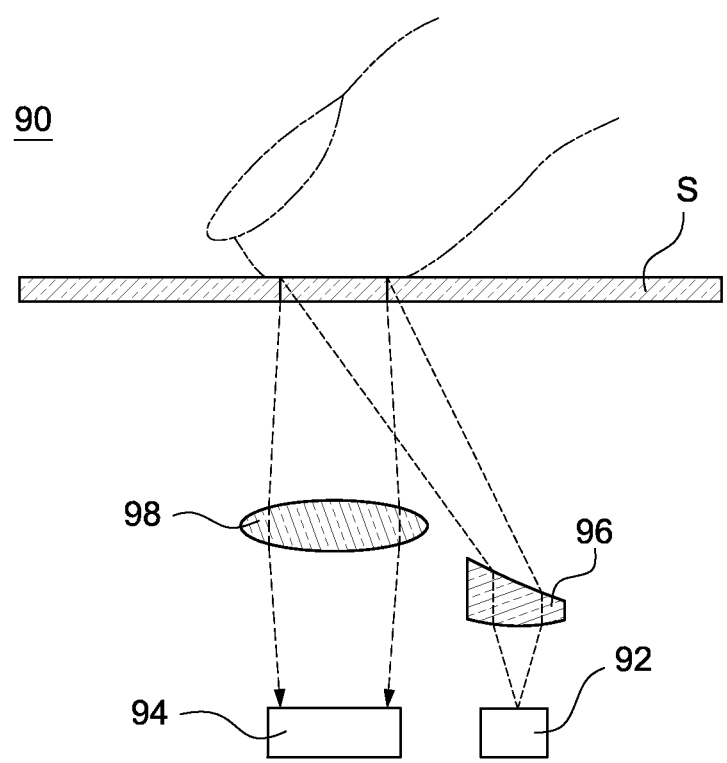
FIG. 8 is a cross sectional view of a conventional optical finger navigation module.

Reference is made to FIG. 7, which is a flow chart showing a manufacturing method of a submount according to the present invention. At first, a silicon ingot is provided (step S800), and the silicon ingot is cut into at least a wafer along a predetermined lattice plane (1, 1, 1) or (0, 0, 1) with a predetermined angle (step S802) so that the wafer has the lattice plane characteristic with the predetermined angle. A photoresist layer is provided and coated on a surface of the wafer (step S804) and then a mask is provided to position on the surface which is coated with the photoresist layer (step S806). After that, a light source is provided and illuminates to the wafer to exposure the photoresist layer (step S808), the mask is removed (step S810) and a developing solution is provided and the wafer is put into the developing solution to remove the non-necessity part of the photoresist layer (step S812). An etching solution, such as potassium hydroxide (KOH), is provided and the wafer is put into the etching solution to form a plurality of recesses on the wafer (step S814). Finally, at least an electrode is provided to attach to the wafer (step S816) and the wafer is cut into a plurality of submounts (step S818).

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A submount for optical device is disposed on a plane and used for disposing an illuminant element or a light-receiving element having an optical axis, the submount comprising:
   a main body, comprising:
   a first surface parallel to the plane and far away from the plane; and
   a second surface parallel to the plane and adjacent to the plane;
   wherein a disposing part of the first surface is tilted with respect to the second surface at a predetermined angle, the illuminant element or the light-receiving element is disposed on the disposing part and the optical axis of the illuminant element or the light-receiving element is tiled with respect to a normal of the second surface at the predetermined angle.

2. The submount in claim 1, wherein the predetermined angle is between 5 and 45 degrees.

3. The submount in claim 1, further comprises two electrodes attached to the first surface.

4. The submount in claim 1, wherein the disposing part is a recess, the recess has a bottom surface and the bottom surface is tilted with respect to the second surface at the predetermined angle.

5. An inputting module, comprising:
   a circuit board having an upper surface and a lower surface;
   an illuminant element package disposed on the upper surface of the circuit board, the illuminant element package comprising:
   a submount, comprising:
   a first surface which is parallel to the circuit board and far away from the circuit board;
   a second surface which is parallel to the circuit board and adjacent to the circuit board, a disposing part of the first surface is tilted with respect to the second surface at a predetermined angle;
   an illuminant element having an optical axis and disposed on the upper surface of the circuit board, the optical axis of the illuminant element is tilted with respect to a normal of the second surface at the predetermined angle; and
   a sensing element disposed on the upper surface of the circuit board, the sensing element comprising a sensing surface and a rear surface which is opposite to the sensing surface, the sensing surface having a sensing area.

6. The inputting module in claim 5, wherein the predetermined angle is between 5 and 45 degrees.

7. The inputting module in claim 5, wherein the illuminant element is a vertical-cavity surface emitting laser die.

8. The inputting module in claim 5, wherein the first surface further comprising a recess and a platform which is opposite to the recess, the recess has a bottom surface and the bottom surface is tiled with respect to a normal of the second surface at the predetermined angle.

9. The inputting module in claim 5, wherein the submount further comprising two electrodes respectively attached to the first surface and the two electrodes electrically connected to two conductive electrodes of the illuminant element.

10. The inputting module in claim 9, further comprising at least a wire bridged over the conductive electrodes and the electrodes.

11. The inputting module in claim 5, further comprising:
    an intermediary board comprising an upper surface and a lower surface opposite to the upper surface, the upper surface is attached to the second surface of the submount;

two electrodes attached to the upper surface of the intermediary board and electrically connected to two conductive electrodes of the illuminant element;

two solder pads attached to the lower surface of the intermediary board and electrically connected to the electrodes.

12. The inputting module in claim 11, further comprising at least a wire bridged over the conductive electrode and the electrode of the illuminant element.

13. The imputing module in claim 12, further comprising a transmissive adhesive disposed on the upper surface of the intermediary board, wherein the illuminant element and the wire are enclosed within the transmissive adhesive.

14. The inputting module in claim 5, wherein the sensing element is a complementary metal-oxide-semiconductor image sensing element.

15. The inputting module in claim 5, further comprising a shield having an opening, the shield is positioned on the sensing element and the opening is aligned to the sensing area of the sensing element.

16. The inputting module in claim 5, wherein the sensing element further comprising a submount, the submount comprising:

a first surface which is parallel to the circuit board and far away from the circuit board;

a second surface which is parallel to the circuit board and adjacent to the circuit board, a disposing part of the first surface is tilted with respect to the second surface at a predetermined angle;

wherein the sensing element is disposed on the disposing part and the optical axis of the sensing element is tiled with respect to a normal of the second surface at the predetermined angle.

17. A manufacturing method of a submount, the submount used for disposing an illuminant element or a light-receiving element, the method comprising:

A. providing a silicon ingot;

B. cutting the silicon ingot into at least a wafer along a predetermined lattice plane with a predetermined angle;

C. coating a photoresist layer on a surface of the wafer;

D. providing a mask and positioning on the surface which coated with the photoresist layer;

E. providing a light source to illuminate the wafer to exposure the photoresist layer;

F. removing the mask;

G. providing a developing solution and putting the wafer into the developing solution to remove the non-necessity part of the photoresist layer;

H. providing an etching solution and putting the wafer into the etching solution to form a plurality of recesses on the wafer;

I. providing at least an electrode and attaching to the wafer;

J. cutting the wafer into a plurality of submounts.

18. The manufacturing method of the submount in claim 17, wherein the predetermined angle is between 5 and 45 degrees.

19. The manufacturing method of the submount in claim 17, wherein the etching solution is potassium hydroxide.

20. The manufacturing method of the submount in claim 17, wherein the predetermined lattice plane is (1, 1, 1) lattice plane or (0, 0, 1) lattice plane.

* * * * *